United States Patent [19]

Hasegawa

[11] Patent Number: 4,531,155
[45] Date of Patent: Jul. 23, 1985

[54] CIRCUIT FOR INDEPENDENTLY ADJUSTING FREQUENCY DEVIATION OF A VCO

[75] Inventor: Kenichi Hasegawa, Neyagawa, Japan

[73] Assignee: Matsushita Electric Industrial Co. Ltd., Osaka, Japan

[21] Appl. No.: 436,369

[22] Filed: Oct. 25, 1982

[30] Foreign Application Priority Data

Oct. 27, 1981 [JP] Japan .................. 56-172314

[51] Int. Cl.³ .................. H04N 1/32; H04B 1/04
[52] U.S. Cl. .................. 358/186; 358/23; 455/196; 455/255
[58] Field of Search .................. 358/186, 23, 25; 455/110, 113, 164, 169, 182, 192, 196, 199, 208, 255, 257, 258, 264; 307/264

[56] References Cited

U.S. PATENT DOCUMENTS 3,626,331 12/1971 Burns .................. 455/110

Primary Examiner—Tommy P. Chin
Attorney, Agent, or Firm—Stevens, Davis, Miller & Mosher

[57] ABSTRACT

A circuit for controlling the application of a signal source to a variable frequency oscillator is disclosed in which the width of frequency deviation and the lower limit frequency of the modulated signal can be set independently of each other. The emitter of a first transistor is connected to a first voltage source through a first resistor. Its base is connected to a signal source through a capacitor, and also to a second voltage source through a switch circuit. The base of a second transistor is connected to the second voltage source and its emitter is connected to the first voltage source through a variable resistor. The emitters of the first and second transistors are connected with each other by a third resistor. The collector current of the second transistor is supplied to a variable frequency oscillator.

6 Claims, 6 Drawing Figures

CIRCUIT FOR INDEPENDENTLY ADJUSTING FREQUENCY DEVIATION OF A VCO

This invention relates to a circuit in which the width of frequency deviation and the lower limit of frequency deviation of a VCO can be adjusted independently.

A conventional circuit for angle modulation of a composite video signal has a drawback in that when the width of frequency deviation is changed or adjusted the lower limit of frequency deviation varies.

Figure 1:
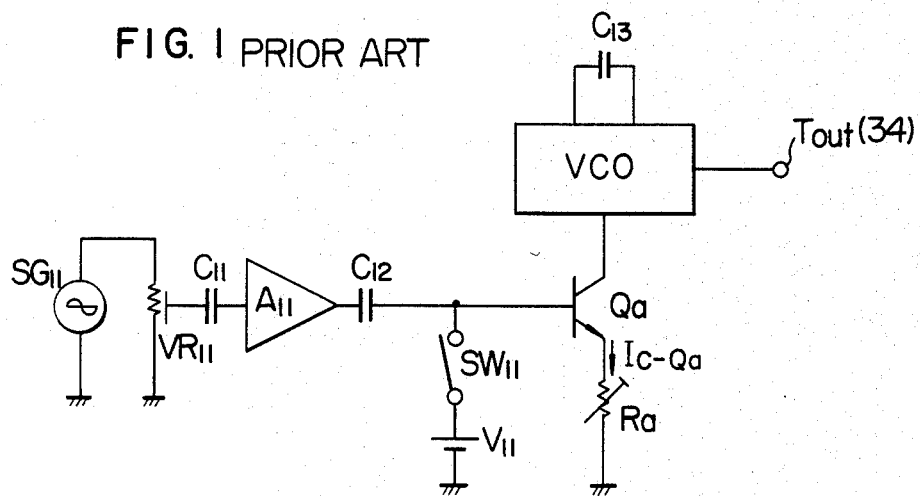
Figure 2:
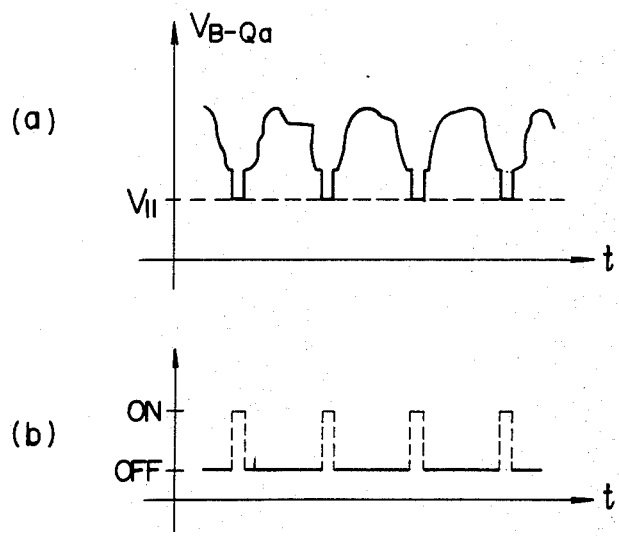

FIG. 1 shows a conventional circuit. The above-mentioned problem will be discussed in more detail with reference to the figure. A video signal supplied from a signal source $SG_{11}$ is voltage divided by a variable resistor $VR_{11}$ and supplied to an amplifier circuit $A_{11}$ through a capacitor $C_{11}$. The output video signal of the amplifier circuit $A_{11}$ is supplied to the base of a transistor $Q_a$ through a capacitor $C_{12}$. The voltage $V_{11}$ of a voltage source $V_{11}$ is supplied also to the base of the transistor $Q_a$ through a switch $SW_{11}$. FIG. 2 is a diagram showing the timing relation between the opening and closing of the switch $SW_{11}$ and the video signal. In FIG. 2(a) the ordinate indicates the base voltage $V_{B-Q_a}$ of the transistor $Q_a$, while in FIG. 2(b) the ordinate indicates the open and close states of the switch $SW_{11}$. The abscissa indicates time t in both figures. Only in the sync-tip period (e.g., horizontal synchronization signal period) of the video signal, the switch $SW_{11}$ is closed and the voltage of sync-tip is clamped at the voltage $V_{11}$. The base voltage $V_{B-Q_a}$ of the transistor $Q_a$ is expressed by $$V_{B-Q_a} = V_{11} + V_{SG11}(t), \quad (1)$$

where $V_{SG11}$ (t) denotes the voltage of the video signal supplied from the signal source SG11, that is, the value of voltage at a time t with the voltage of sync-tip referred as 0V.

Thus, the collector current $I_{C-Q_a}$ of the transistor $Q_a$ may be given by $$I_{C-Q_a} = \frac{V_{B-Q_a} - 0.75 \, V}{R_a}, \quad (2)$$

if the current gain $h_{FE}$ is sufficiently large. Here, the value 0.75 V is the voltage drop between the base and the emitter of the transistor $Q_a$ which is in active state. The collector current $I_{C-Q_a}$ of the transistor $Q_a$ is conducted to a variable frequency oscillator VCO, and a frequency modulated signal is derived from an output terminal $T_{OUT}$.

Figure 3:
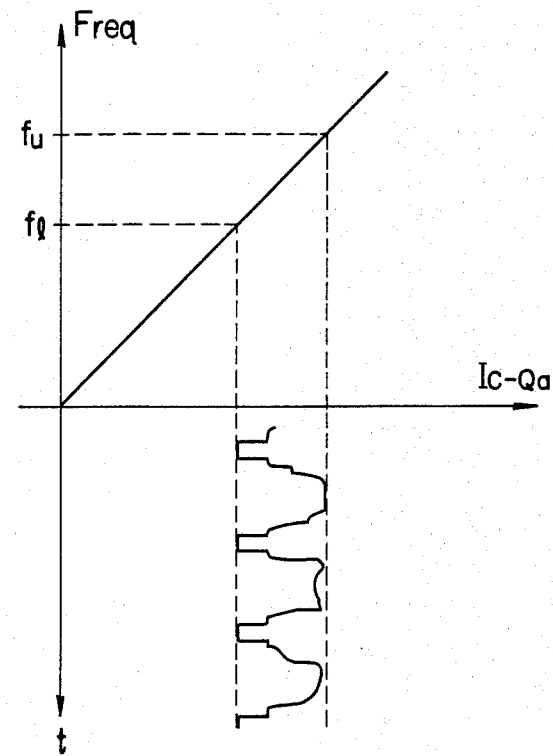

FIG. 3 shows the relation between the oscillation frequency of the variable frequency oscillator VCO and the current $I_{C-Q_a}$. The ordinate above the origin is the oscillation frequency Freq and the abscissa is the current $I_{C-Q_a}$. The ordinate below the origin expresses the time t. The oscillation frequency Freq and the current $I_{C-Q_a}$ have the following relation.

$$\text{Freq} = K \cdot I_{C-Q_a}, \quad (3)$$

where K is a constant. It is so adjusted that the level of the video signal in the sync-tip period corresponds to a lower limit $f_l$ of the frequency deviation while the white level corresponds to an upper limit $f_u$ of the frequency deviation. The variable frequency oscillator VCO need not be any special circuit. For example, a voltage controlled multivibrator as disclosed in Japanese Patent Application No. 51-85313 (No. 85313/76) by the same assignee of the present application may be applied.

Figure 4:
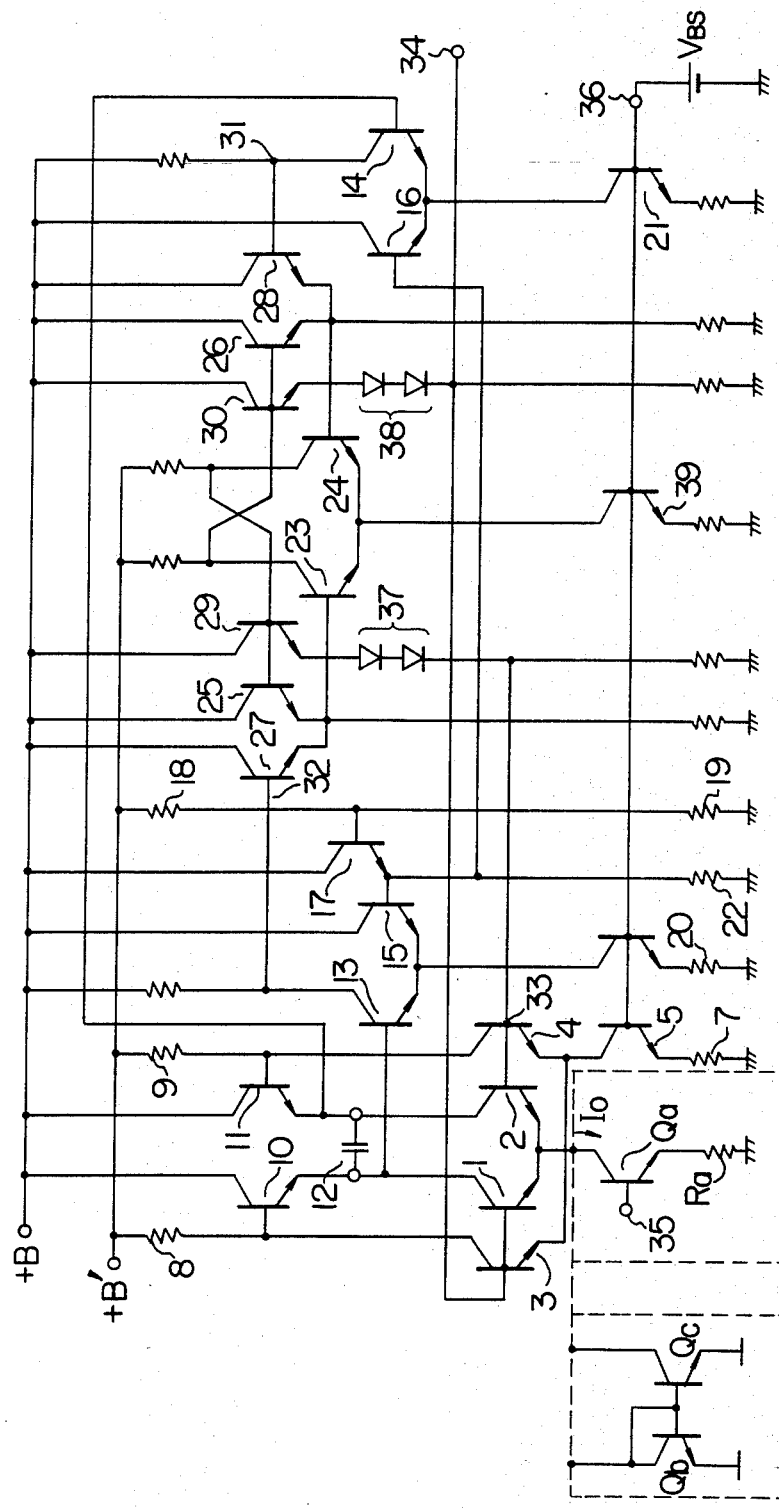

FIG. 4 shows the variable frequency oscillator, where transistors 1 and 2, and 3 and 4, constitute differential switching circuits which switches the collector current $I_o$ of the transistor $Q_a$ and the current of a current source formed by a transistor 5 and a resistor 7. A terminal 36 is connected to a voltage source $V_{BS}$. $R_a$ and 7 denote resistors. The transistor $Q_a$ and the resistor $R_a$ which was already shown in FIG. 1 are surrounded with a broken line. Resistors 8 and 9 are connected to the collectors of the transistors 3 and 4, respectively. A capacitor 12 is connected to the emitters of the transistors 10 and 11. Transistors 13, 14 and 15, 16 constitute voltage comparators which compare the voltage across the capacitor 12 and the emitter voltage of a transistor 17. Resistors 18 and 19 divide the voltage of a power source +B' in order to supply a reference voltage to the comparator circuits. The values of current of the current sources 20 and 21, which are constituted with a resistor and a transistor, are equal to each other. A current source 22 supplies an appropriate value of current. Transistors 29 and 30 form a flip-flop circuit in which 31 and 32 are input terminals and 33 and 34 are output terminals having opposite phases to each other.

The function of the flip-flop circuit is as follows. When the collector current of the transistor 13 falls below a predetermined level, the output terminals 33 and 34 have low and high levels, respectively. Even if the collector current of the transistor 13 rises above the predetermined level thereafter, the output states are held until the collector current of the transistor 14 falls below a predetermined level. Furthermore, if the collector current of the transistor 14 falls below the predetermined level, the output terminal 33 is turned to the high level and the output terminal 34 is turned to the low level. When the collector current of the transistor 14 rises above a predetermined level after the reversal of the output state, the output state is held until the collector current of the transistor 13 falls below the predetermined level.

By the switching action of the transistors 3 and 4, the base voltage of the transistors 10 and 11 can be equal to the voltage +B' or smaller than it because of a voltage drop due to the current of the current source 5 flowing through the resistor 8 or 9. The lower voltage level due to this voltage drop is set to be equal to a value high enough that either the transistor 10 or 11 does not become conductive just before the emitter voltage of the transistor 10 or 11 drops to reverse the flip-flop. It is desirable that the emitter voltage of the transistor 10 or 11 at which the flip-flop begins to reverse is set to be equal to the emitter voltage of the transistor 17 in order that the temperature drift compensation can be made more perfectly.

The transistor 17 performs temperature compensation for a temperature drift of the transistors 10 and 11. Since the transistors 13, 15 and 14, 16 are connected in such a manner that the temperature drift of the forward voltage between the base and the emitter can be compensated, the voltage swing across the capacitor 12 does not vary with the temperature drift. The collector current $I_o$ of the transistor $Q_a$ is determined by an input voltage applied to the base input terminal 35 and the resistor $R_a$. The temperature drift in $I_o$ can be minimized by externally connecting as $R_a$ a carbon film resistor or a metal film resistor with a small temperature drift coefficient to the main semiconductor IC, since the temperature drift of the forward voltage between the base and the emitter of the transistor $Q_a$ can be easily compensated by its base bias. Therefore, by choosing for the capacitor 12 a capacitor with a small temperature drift coefficient, the frequency of oscillation output becomes stable against any temperature variation. Moreover, in this case, three terminals, i.e. the both ends of the capacitor and the connection terminal of $R_a$, can serve as the connection terminals to the exterior of the IC.

The switching section of the flip-flop circuit is constituted with transistors 23 and 24. Transistors 25 and 26 are provided for the purpose of positive feedback. The input terminals of the flip-flop circuit receive the output of the voltage comparators, and supplied through transistors 27 and 28. A d.c. bias source is connected to a terminal 36 to feed the current sources. The source voltage $+B'$ is made a little lower than the source voltage $+B$. According to the operation of the flip-flop circuit, when the base voltage of the transistor 27 rises while the transistor 23 is in the cut-off state, the base voltage of the transistor 27 can become higher than the base voltage of the transistor 26. This makes the transistor 23 conductive while cutting off the transistor 24. After this reversal, even if the base voltage of the transistor 27 drops, the output state is held since the base voltage of the transistor 25 is higher than the base voltages of the transistors 26 and 28. 37 and 38 denote diodes and 39 denotes a current source transistor.

The relation between the collector current $I_o$ of the transistor $Q_a$ and the oscillation frequency Freq in FIG. 4 is expressed as $$\text{Freq} = K' \cdot I_o. \quad (3')$$

The oscillation output appears at the output terminal 34 ($T_{OUT}$).

The oscillation frequency Freq of the signal derived from the output terminal $T_{OUT}$ (34) in FIG. 1. may be expressed from eqs. (1), (2) and (3) as $$\text{Freq} = K \times \left( \frac{V_{11} - 0.75\ V}{R_a} + \frac{V_{SG11}(t)}{R_a} \right). \quad (4)$$

Now, explanation will be made of the procedure of adjusting the upper and lower limits of the frequency deviation of the output signal of the circuit in FIG. 1 to preliminarily determined values $f_u$ and $f_l$, respectively. The second term of eq. (4) expresses a variation due to the video signal input $V_{SG11}(t)$, which becomes maximum at the white level and 0V in the sync-tip period. The frequency deviation of the oscillation frequency tends to the upper limit in the white level, while it tends to the lower limit in the sync-tip period. When the resistance of the variable resistor $VR_{11}$ is varied, the voltage of the white level of the video signal $V_{SG11}(t)$ changes, whereby the width of the frequency deviation is varied. The first term of eq. (4) expresses the off-set value of the oscillation frequency. When the video signal $V_{SG11}(t)$ is in the sync-tip period, $V_{SG11}(t)$ becomes 0V and hence the second term of eq. (4) becomes zero. Therefore, the first term of eq. (4) expresses the lower limit of the frequency deviation.

If the value of the resistor $R_a$ in FIG. 1 is varied in order that the lower limit value of the frequency deviation of the frequency modulation may be set at a predetermined value $f_l$, not only the first term of eq. (4) but also the second term of eq. (4) varies. Namely, the width of frequency deviation varies.

Due to this phenomenon, the most important point of adjustment in the prior art of FIG. 1 becomes as follows: the first step is to vary the value of the resistor $R_a$ to set the lower limit of frequency deviation at $f_l$, and the second step is to vary the value of the variable resistor $VR_{11}$ to set the width of frequency deviation at $(f_u - f_l)$. This order of adjustment should not be reversed. Therefore, in the adjustment process of a mass production line or when some repair becomes necessary due to the appearance of inferior components or when the values of $f_u$ and $f_l$ must be changed as desired, there occurs a problem that no careless mistake can be allowed in the order of adjustment.

The objective of this invention therefore is to provide a circuit for controlling a VCO in which the setting of the width of frequency deviation and the setting of the lower limit frequency deviation can be done independently from each other. A first transistor constitutes an emitter follower where a first resistor is connected with the emitter. The base of the first transistor is connected to a signal source of the composite video signal through a capacitor and also to a second voltage source through a switch. The base of a second transistor is connected to the second voltage source and its emitter is connected to a first voltage source through a second resistor. The emitter of the first transistor and the emitter of the second transistor are connected with each other through a third resistor. The collector current of the second transistor is supplied to a variable frequency oscillator.

Figure 5:
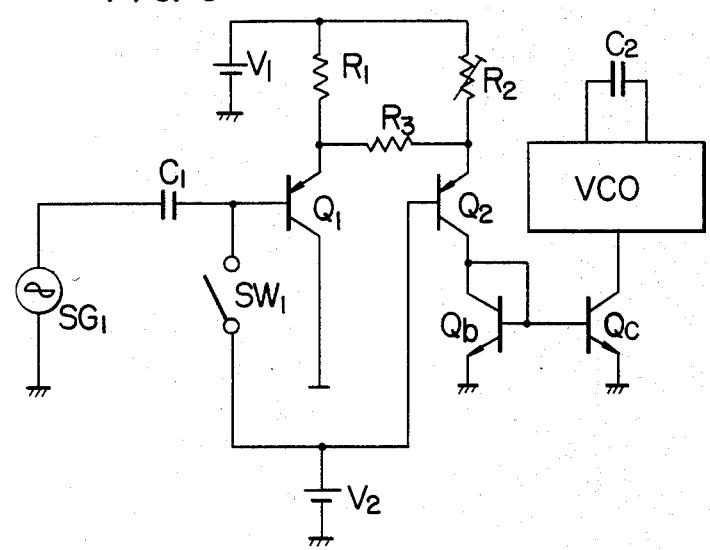

The present invention will be explained in more detail with reference to the accompanying drawings, in which:

FIG. 1 is a diagram of the conventional frequency modulation circuit;

FIGS. 2(a) and (b), and FIG. 3 show waveforms for the explanation of the operation of the above circuit;

FIG. 4 is a diagram showing an example of the variable frequency oscillation circuit shown in FIG. 1; and FIG. 5 is a diagram showing a frequency modulation circuit according to one embodiment of this invention.

In FIG. 5 showing an embodiment of this invention, the variable frequency oscillator VCO is the same as used in FIG. 4. Transistors $Q_b$ and $Q_c$ shown in FIG. 5 are connected in place of the elements as shown in the broken lines in FIG. 4. A video signal supplied from a signal source $SG_1$ is supplied to the base of the transistor $Q_1$ through a capacitor $C_1$. The voltage $V_2$ of a voltage supply $V_2$ is also supplied to the base of the transistor $Q_1$ through a switch $SW_1$. The emitter of the transistor $Q_1$ is connected to a voltage source $V_1$ through a resistor $R_1$. The emitter of the transistor $Q_2$ is connected to the voltage source $V_1$ through a resistor $R_2$ while its base is connected to the voltage source $V_2$. The collector of the transistor $Q_2$ is connected to the collector and the base of the transistor $Q_b$. The base and the emitter of the transistor $Q_c$ are connected to the base and the emitter of the transistor $Q_b$, respectively. The collector of the transistor $Q_c$ is connected to the variable frequency oscillator VCO (e.g., by substituting the block including $Q_b$, $Q_c$ for the block including $Q_a$ respectively indicated by broken lines in FIG. 4). The transistors $Q_b$ and $Q_c$ constitute a current mirror circuit.

The switch $SW_1$ is closed only in the sync-tip period of the video signal. The capacitor $C_1$, the switch $SW_1$ and the voltage source $V_2$ operate in the similar manner as the capacitor $C_{12}$, the switch $SW_{11}$ and the voltage source $V_{11}$ in FIG. 1, respectively. As a result, the base of the transistor $Q_1$ is supplied with the video signal with its sync-tip voltage clamped at the voltage $V_2$. The transistor $Q_1$ acts as an emitter follower with the resistor $R_1$. The base voltage of the transistor $Q_2$ is equal to the voltage $V_2$. The current $I_{E-Q2}$ flowing into the emitter of the transistor $Q_2$ is given by a sum of a current $I_{R2}$ flowing from the voltage source $V_1$ through the resistor $R_2$ and a current $I_{R3}$ flowing from the side of transistor $Q_1$ through the resistor $R_3$. The current $I_{R2}$ is given by $$I_{R2} = \frac{V_1 - (V_2 + 0.75\ V)}{R_2}, \tag{5}$$

where the value of 0.75 V is the voltage drop between the base and the emitter of the transistor $Q_2$ (and $Q_1$) which is in active state.

Next, let us calculate the current $I_{R3}$. The emitter voltage $V_{E-Q2}$ of the transistor $Q_2$ is given by $$V_{E-Q2} = V_2 + 0.75\ V. \tag{6}$$

Due to the clamp action of the capacitor $C_1$ and the switch SW1, the emitter voltage $V_{E-Q1}$ of the transistor $Q_1$ is expressed as $$V_{E-Q1} = V_2 + 0.75\ V + V_{SG1}(t), \tag{7}$$

where $V_{SG1}$ (t) denotes the voltage of a video signal supplied from the signal source SG1 with the sync-tip part expressed as 0V. Therefore, the current $I_{R3}$ flowing through the resistor $R_3$ becomes $$I_{R3} = \frac{V_{E-Q1} - V_{E-Q2}}{R_3} = \frac{V_{SG1}(t)}{R_3}. \tag{8}$$

Thus, the emitter current $I_{E-Q2}$ of the transistor $Q_2$ becomes $$I_{E-Q2} = \frac{V_{SG1}(t)}{R_3} + \frac{V_1 - (V_2 + 0.75\ V)}{R_2}. \tag{9}$$

If we assume that the current gain $h_{FE}$ of the transistors $Q_2$, $Q_b$ and $Q_c$ are sufficiently large, the collector current $I_{C-QC}$ of the transistor $Q_c$ becomes equal to the emitter current $I_{E-Q2}$ of the transistor $Q_2$. If the variable frequency oscillator VCO is the same as the one shown in FIG. 1, the oscillation frequency Freq is expressed as $$\text{Freq} = K\left( \frac{V_{SG1}(t)}{R_3} + \frac{V_1 - (V_2 + 0.75\ V)}{R_2} \right). \tag{10}$$

The first term of eq. (10) corresponds to a level variation of the input video signal and indicates that changing of the resistance of resistor $R_3$ is equivalent to a change of the video signal level. Since the voltage $V_{SG1}$ in the sync-tip period is $$V_{SG1}(g) = 0V.$$

only the width of frequency deviation changes when the value of the resistor $R_3$ is varied. The numerator of the second term of eq. (10) is constant. Hence, only the oscillation frequency Freq changes with a variation of the value of the resistor $R_2$ while the width of frequency deviation makes no variation. Therefore, in the embodiment of FIG. 5, the order of setting the lower limit frequency $f_l$ of frequency deviation and the width thereof ($f_u$-$f_l$) in the frequency modulation circuit can be done arbitrarily. Namely, the lower limit frequency $f_l$ can be adjusted by the resistor $R_2$ while the width of frequency deviation ($f_u$-$f_l$) can be adjusted by the resistor $R_3$. Although in the circuit of FIG. 5 the collector current of the transistor $Q_2$ is transmitted to the variable frequency oscillator VCO by using transistors $Q_b$ and $Q_c$, it is needless to say that the transmission circuit may be formed in another way. The circuits of FIGS. 4 and 5 may be constituted by using transistors of opposite conduction type. Furthermore, the collector current of the transistor $Q_2$ may be transmitted without using the current mirror circuit.

As described above, this invention removes any limitation on the order of adjustment in the angle modulation circuit for the video signal. This increases the degree of veratility in the adjusting process of a mass production line or in experiment for or in examination of the circuit. Therefore, the invention has a large industrial merit.

I claim:

1. A circuit for controlling a variable frequency oscillator in response to an applied signal source comprising:
    a first transistor having a base, emitter and collector with the base connected to receive said signal source through a capacitor,
    a first current source connected to the emitter of said first transistor,
    a switch for connecting the base of said first transistor to a voltage source,
    a second transistor having a base, emitter and collector with the base connected to said voltage source,
    a second current source connected to the emitter of said second transistor,
    a resistor connecting the emitter of said first transistor with the emitter of said second transistor, and
    a variable frequency oscillator responsive to collector current of said second transistor.

2. A circuit according to claim 1, wherein said signal source generates a composite video signal and said switch is closed only in the period of a horizontal synchronization signal of said video signal.

3. A circuit according to claim 1, wherein said first current source includes a fixed resistor and said second current source includes a variable resistor.

4. A circuit according to claim 1, wherein collector current of said second transistor is supplied to said variable frequency oscillator through a current mirror circuit.

5. A modulation circuit comprising:
    a first transistor having a base and emitter with the base for receiving a composite video signal through a capacitor,
    first and second constant voltage sources,
    a first resistor connecting the emitter of said first transistor with said first constant voltage source,
    a switch for connecting the base of said first transistor to said second constant voltage source,
    a second transistor having a base, emitter and collector with the base connected to said second constant voltage source, a second resistor connecting said first constant voltage source with the emiter of said second transistor, a third resistor connecting the emitter of said first transistor with the emitter of said second transistor, and a variable frequency oscillator responsive to collector current of said second transistor.

6. A circuit according to claim 5, wherein collector current of said second transistor is supplied to said variable frequency oscillator through a current mirror circuit.

* * * * *